US012603118B2

(12) United States Patent
Verma

(10) Patent No.: US 12,603,118 B2
(45) Date of Patent: Apr. 14, 2026

(54) STATIC RANDOM ACCESS MEMORY SUPPORTING A DYNAMICALLY VARIABLE DURATION SELF-TIME DELAY FOR A SINGLE CLOCK CYCLE READ-MODIFY-WRITE OPERATION

(71) Applicant: STMicroelectronics International N.V., Geneva (CH)

(72) Inventor: Praveen Kumar Verma, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 206 days.

(21) Appl. No.: 18/389,314

(22) Filed: Nov. 14, 2023

(65) Prior Publication Data

US 2024/0170032 A1 May 23, 2024

Related U.S. Application Data

(60) Provisional application No. 63/426,101, filed on Nov. 17, 2022.

(51) Int. Cl.
*G11C 7/22* (2006.01)
*G11C 7/10* (2006.01)
*G11C 8/10* (2006.01)

(52) U.S. Cl.
CPC .............. *G11C 7/222* (2013.01); *G11C 7/106* (2013.01); *G11C 7/1069* (2013.01); *G11C 8/10* (2013.01)

(58) Field of Classification Search
CPC ....... G11C 7/222; G11C 7/106; G11C 7/1069; G11C 8/10; G11C 7/1006
See application file for complete search history.

(56) References Cited

U.S. PATENT DOCUMENTS

| | | | |
|---|---|---|---|
| 6,073,219 A | 6/2000 | Ohno | |
| 6,973,551 B1* | 12/2005 | Walton | G06F 9/3004 |
| | | | 711/155 |
| 7,483,289 B2 | 1/2009 | Jain | |
| 7,684,257 B1 | 3/2010 | Lee et al. | |
| 8,850,137 B2 | 9/2014 | Nazar et al. | |
| 9,305,634 B1* | 4/2016 | Minkler | G11C 8/10 |
| 2006/0107003 A1 | 5/2006 | Barnum et al. | |
| 2008/0183984 A1* | 7/2008 | Beucler | G11C 7/1075 |
| | | | 711/155 |

(Continued)

*Primary Examiner* — Amir Zarabian
*Assistant Examiner* — Bradley S Coon
(74) *Attorney, Agent, or Firm* — Crowe & Dunlevy LLC

(57) ABSTRACT

A memory array includes memory cells forming a data word location accessed in response to a word line signal. A data sensing circuit configured to sense data on bit lines associated with the memory cells. The sensed data corresponds to a current data word stored at the data word location. A data latching circuit latches the sensed data for the current data word from the data sensing circuit. A data modification circuit then performs a mathematical modify operation on the current data word to generate a modified data word. The modified data word is then applied by a data writing circuit to the bit lines for writing back to the memory cells of the memory array at the data word location in response to assertion of control signal having a dynamically variable delay dependent on the current data word. The operations are advantageously performed within a single clock cycle.

44 Claims, 6 Drawing Sheets

(56) References Cited

U.S. PATENT DOCUMENTS

| | | | | |
|---|---|---|---|---|
| 2012/0089793 A1* | 4/2012 | Nazar | .................. | G11C 7/1006 |
| | | | | 711/155 |
| 2016/0266899 A1* | 9/2016 | Tiwari | ............... | G06F 9/30021 |

* cited by examiner

STATIC RANDOM ACCESS MEMORY SUPPORTING A DYNAMICALLY VARIABLE DURATION SELF-TIME DELAY FOR A SINGLE CLOCK CYCLE READ-MODIFY-WRITE OPERATION

CROSS-REFERENCE TO RELATED APPLICATIONS

This application claims priority to U.S. Provisional Application for Patent No. 63/426,101, filed Nov. 17, 2022, the disclosure of which is incorporated herein by reference.

TECHNICAL FIELD

The present invention generally relates to a static random access memory (SRAM) circuit and, in particular, to an SRAM circuit configured to perform a read-modify-write operation in a single clock cycle with a self-time delay having a dynamically variable duration.

BACKGROUND

Reference is made to FIG. 1 which shows a block diagram of a circuit 10 including a static random access memory (SRAM) 12 that is configured to store data. In a particular application, the stored data is histogram data where each data word location (dw loc) in the memory array 16 of the SRAM 12 stores a count value (Count). As part of the operation of the circuit 10 for building a histogram, the count value is modified in some way (for example, incremented by one) each time the data word location is accessed. This operation typically involves three steps: step 1) reading the n-bit current count value from a particular data word location of the SRAM 12 accessed in response to an m-bit memory address (Address); step 2) mathematically modifying the current count value (for example, incrementing by one); and step 3) writing the modified count value back to the SRAM 12 at the accessed data word location. The step 2) operation for mathematically modifying the count value is performed here by a data modification circuit 14 that is external to (and separate from) the SRAM 12. The data modification circuit 14 is coupled to the data output (Q) port and data input (D) port of the SRAM 12 through one or more n-bit data bus circuits. As an example, the data modification circuit 14 may comprise an n-bit adder circuit that operates on the current count value read from the memory at the data output (Q) to increment by one and output the modified count value to be written back to the memory at the data input (D).

Reference is now made to FIG. 2 which shows a timing diagram for the operation of the circuit 10. At time t1, the chip select signal (CSN) is asserted logic low to select the SRAM 12 and the write enable signal (WEN) is deasserted logic high to place the SRAM 12 in data read mode. At time t2, the memory address (Address) is applied and the clock signal CLK pulses a first time to initiate a read operation. The Address is decoded by the SRAM 12 and the word line (WL) coupled to the data word location (dw loc) corresponding to the decoded Address is asserted logic high at time t3. The count value (Count) is then read (step 1) from the addressed data word location in the array 16 and output at time t4 through the data output (Q) port of the SRAM 12. The chip select signal (CSN) is then deasserted logic high at time t5 to deselect the SRAM 12 so that the SRAM 12 does not perform an operation in response to the next pulse of the clock signal CLK. At time t6, the clock signal CLK pulses a second time to cause the data modification circuit 14 to perform the mathematical modify operation (step 2) at time t7, which in this example case is an increment by one (+1) operation. The modified count value (Count+1) is then applied by the data modification circuit 14 to the data input (D) port of the SRAM 12 at time t8. At time t9, the write enable signal (WEN) is asserted logic low to place the SRAM 12 in write mode. The chip select signal (CSN) is then asserted logic low at time t10 to select the SRAM 12. At time t11, the memory address (Address) is applied (e.g., remains applied from the read) and the clock signal CLK pulses a third time to initiate a data write operation. The Address is decoded by the SRAM 12 and the word line (WL) coupled to the data word location (dw loc) is asserted logic high at time t12. The modified count value (Count+1) is then written (step 3) from the data input port of the SRAM 12 at time t13 to the addressed data word location.

There are a number of concerns with the circuit 10 of FIG. 1 and its operation as detailed in FIG. 2. The circuit operation is multi-cycle in that it requires three clock cycles and two separate word line assertions to complete. Because of this multi-cycle operation, there is significantly high power consumption in the circuit 10 due to data signal toggling. The power consumption concern is further magnified by the fact that the mathematical modify part of the operation (step 2) occurs external to the SRAM 12 and thus there is toggling of data for the data signals at both the data output (Q) port and data input (D) port.

Reference is made to FIG. 3 which shows a block diagram of a circuit 110 including a static random access memory (SRAM) 112 that is configured to store data. In a particular application, the stored data is histogram data where each data word location (dw loc) in the SRAM 112 stores a count value (Count). As part of the operation of the circuit 110 for building a histogram, the count value is modified in some way (for example, incremented by one) each time the data word location is accessed. This operation typically involves three steps: step 1) reading the n-bit current count value from a particular data word location of the memory 112 accessed in response to an m-bit memory address (Address); step 2) mathematically modifying the current count value (for example, incrementing by one) over a fixed duration self-time delay; and step 3) writing the modified count value back to the particular data word location in the SRAM 112. The step 2) operation for mathematically modifying the count value is advantageously performed internally within the SRAM 112. Because of this, there is no need to toggle data signals at the data output (Q) port and data input (D) port of the SRAM 112, and there is no external data calculation operation performed, and thus there is a reduction in power consumption in comparison to the solution shown in FIG. 1. Still further, by performing the mathematical modify operation internally for step 2) of the read-modify-write operation, there is no implication of external circuitry and the overall operation can be performed by the SRAM itself in a single clock cycle.

The SRAM 112 is clocked by a clock signal CLK and includes a memory array 114 comprising a plurality of n-bit accessible data word locations (dw loc). In response to an applied m-bit memory address (Address) and a pulsing of the clock signal CLK, a word line WL is asserted to select and access one of the data word locations in the memory array 114. The bit lines 116 of the memory array 114 are coupled to a data sensing circuit 118. The data sensing circuit 114 is formed by a plurality of sense amplifiers (one sense amplifier per data bit of the n-bit data word at the accessed data word location). The data sensing circuit 118 is enabled to perform the data sensing operation on the bit lines 116 in response to assertion of a sense amplifier enable (SAEN) signal in order to read the data word (i.e., the count value (Count)) from the accessed data word location in the memory array 114. The timing of assertion of the SAEN signal can be controlled following the leading edge of the clock signal CLK based on a dummy read operation performed by the SRAM 112. This ensures that the sense amplifiers are not enabled to drive voltages on the sense amplifier output (SA out) lines until it is clear that the data bits are available in response to assertion of the word line signal. A data latch circuit 120 then latches the read data word (here, the count value) from the SA out lines and asserts a latch signal 121. A data modification circuit 122 that is internal to the SRAM 112 performs a data modification on the latched data word. As an example, the data modification circuit 122 may comprise an n-bit adder circuit that operates on the latched data word (which is the current count value stored in the memory) to increment by one and output the modified data word (i.e., Count+1). A dummy adder circuit is triggered by the latch signal 121 to perform a sequential addition operation across n bits (i.e., a number of bits equal to the number of bits in the latched data word). An overflow of the sequential addition operation in the dummy adder circuit generates a data modification complete signal mCmplt that is asserted to indicate that sufficient time has passed for the data modification circuit 122 to complete the data modification operation. The data modification complete signal mCmplt controls timing for when to begin the write phase. This ensures that the modified data to be written back to the memory is an accurate modification. A data write circuit 124 triggered by the assertion of the data modification complete signal mCmplt then writes the data bits of the modified data word back to the bit lines 116 to be stored at the accessed data word location in the memory array 114. It will be noted that because of read multiplexing circuitry, not explicitly shown, the data sensing circuit 118 at this point in time has been disconnected from the bit lines and the SAEN signal is no longer asserted. Following completion of the data write, the word line signal is deasserted. Timing of completion of the write operation can be controlled based on a dummy write operation performed by the SRAM 112. This ensures that the data bits of the modified data word remain on the bit lines 116 for a sufficient amount of time to ensure successful write back into the memory cells M.

Reference is now made to FIG. 4 which shows a timing diagram for operation of the circuit 110. At time t1, the SRAM 112 is enabled for operation and the bit lines 116 are precharged to a precharge voltage level (shown here, by example only, at Vdd). At time t2, the memory address (Address) is applied and the clock signal CLK pulses. The Address is decoded by the SRAM 112 and the word line (WL) coupled to the data word location (dw loc) corresponding to the decoded Address is asserted logic high at time t3. In response to the asserted word line signal and the logic state of the stored data, the voltage on the bit lines begins to discharge from Vdd. At time t4, the sense amplifier enable (SAEN) signal is asserted logic high to enable operation of the sense amplifiers within the data sensing circuit 118. The sense amplifiers respond at time t5 to sense the voltage on the bit lines 116 and drive corresponding output signals (SA out) from the data sensing circuit 118 to logic high or logic low levels dependent on the logic state of the bits of the data word stored in the accessed data word location. Thus, the data word has been read (step 1) from the memory array 114 and the output of the data sensing circuit 118 now reflects the count value (Count). The data latch circuit 120 latches the read data word from the output of the data sensing circuit 118 at time t6, and thus the latched data also reflects the count value (Count). The data modification circuit 122 then performs the mathematical modify operation (step 2) at time t7, which in this example case is an increment by one (+1) operation, and the output modified data from the data modification circuit 122 at time t8 reflects the incremented count value (Count+1). Simultaneously, the dummy adder circuit (triggered through signal 121 by latching of the read data word at time t6) performs the sequential addition operation over n bits and overflows at time t8 to trigger assertion of data modification complete signal mCmplt indicating that sufficient time has passed to complete the mathematical modify operation. In response thereto, the data write circuit 124 then applies the data bits of the modified data word back to the bit lines 116 (noting here that the voltage of the bit line(s) has continued to slowly discharge in response to the continued assertion of the wordline signal). Because the signal on the word line (WL) remains asserted logic high, the modified data word is then written (step 3) at time t9 for storage at the accessed data word location in the memory array 114. Following completion of the data write operation at time t10, a reset is performed at time t11 and the word line (WL) is deasserted logic low.

A detailed implementation of the circuit 110 shown in FIG. 3 is taught by U.S. patent application Ser. No. 17/861,384, filed Jul. 11, 2022 (claiming priority from U.S. Provisional Application for Patent No. 63/231,852, filed Aug. 11, 2021), the disclosure of which is incorporated herein by reference.

It will be noted that the duration of the self-time delay for the assertion of the wordline (i.e., the time between time t3 and time t11) is fixed. The portion of the self-time delay for the read of the memory (from time t3 to time t6—step 1) is controlled by the fixed duration of time associated with performing the dummy read operation, assertion of the sense amp enable (SAEN) signal and latching of the read data by the data latch circuit. The portion of the self-time delay for the increment operation (from time t6 to time t8—step 2) is controlled by the fixed duration of time associated with performing the sequential addition operation over n bits by the dummy adder circuit. Furthermore, the portion of the self-time delay for the write of the memory (from time t8 to time t11—step 3) is controlled by the fixed duration of time associated with performing the dummy write operation and writing the data back to the memory.

There are a number of concerns with this fixed duration self-time delay for the increment operation. The longer the self-time delay, the greater the magnitude of the bit line discharge that occurs (as noted above because the word line remains asserted). As a result of the bit line discharge, there is a corresponding increase in the amount of power that will need to be expended in order to recharge the bit line (at time t11). Furthermore, more peak current is required by the system for the bit line recharge operation due the fact that all simultaneously discharged bit lines are being simultaneously recharged.

There is accordingly a need in the art to address the power consumption concerns and provide a more efficient implementation of the read-modify-write operation.

SUMMARY

In an embodiment, a circuit is clocked by a clock signal and comprises: a memory array including memory cells forming a data word location accessed in response to a word line signal; a plurality of bit lines associated with said memory cells; a data sensing circuit configured to sense data on said plurality of bit lines, said sensed data corresponding to a current data word stored at the data word location; a data latching circuit configured to latch the sensed data for said current data word from the data sensing circuit; a data modification circuit configured to perform a mathematical modify operation on the current data word to generate a modified data word; a data writing circuit actuated in response to assertion of a data modification complete signal to apply data for the modified data word to the plurality of bit lines for writing back to the memory cells of the memory array at said data word location; wherein the sensing of the data on said plurality of bit lines, the latching of the sensed data, the performing of the mathematical modify operation and the writing back of the modified data word all occur within a single cycle of the clock signal; and a delay circuit configured to delay assertion of the data modification complete signal by a delay duration that is dynamically dependent on the current data word.

In an embodiment, a circuit comprises: a memory array including memory cells forming a data word location accessed in response to a word line signal; a plurality of bit lines associated with said memory cells; and an input/output circuit for each bit line, comprising: a sensing circuit configured to sense and latch data on the bit line; an adder circuit configured to perform an addition operation, said adder circuit having a first input coupled to receive latched data from the sensing circuit, a second input coupled to receive data from the adder circuit of the input/output circuit for a lower significance bit line, a sum output, and a carry output coupled to supply data to the second input of the adder circuit of the input/output circuit for a higher significance bit line; a carry comparison logic gate configured to compare a logic state of the carry output of the adder circuit to a fixed logic state; and a data write circuit configured to write the sum output of the adder circuit to the bit line in response to assertion of a data modification complete signal; and a combination logic gate having inputs coupled to an output of each carry comparison logic gate and an output producing the data modification complete signal.

BRIEF DESCRIPTION OF THE DRAWINGS

For a Better Understanding of the Embodiments, Reference Will Now be Made by Way of Example Only to the Accompanying Figures in which.

DETAILED DESCRIPTION

Figure 1:
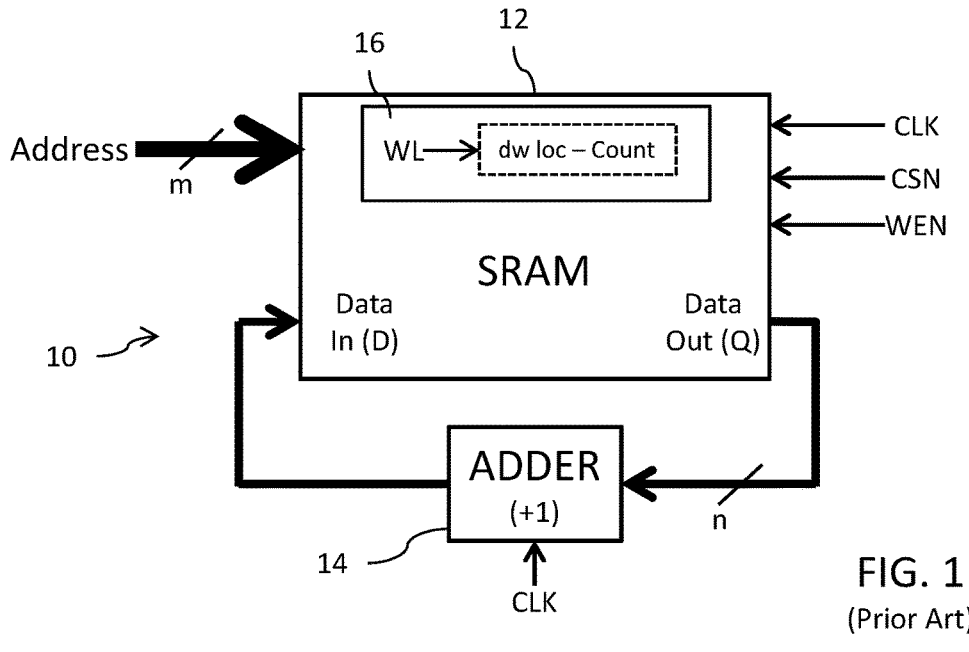
FIG. 1 shows is a block diagram of a circuit configured to perform a read-modify-write operation with respect to a count value stored in a static random access memory (SRAM) using an external modify circuit.
Figure 2:
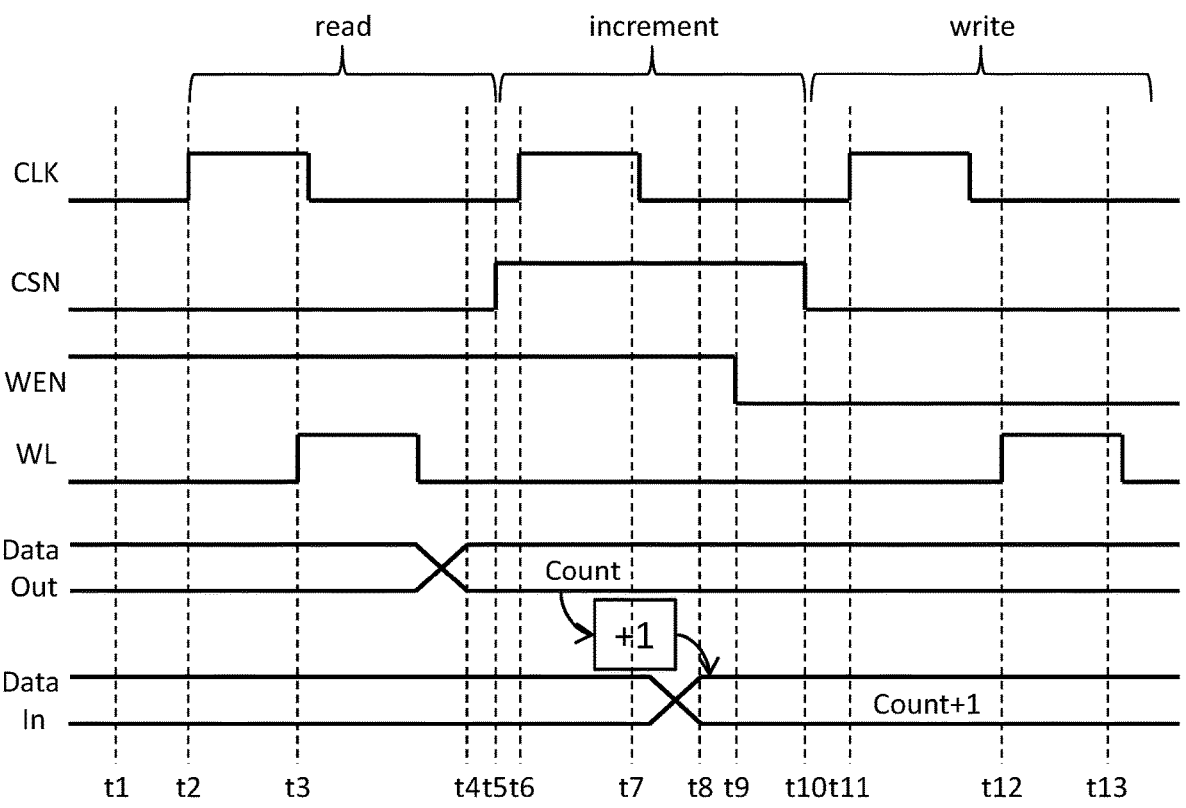
FIG. 2 shows a timing diagram for operation of the circuit of FIG. 1.
Figure 3:
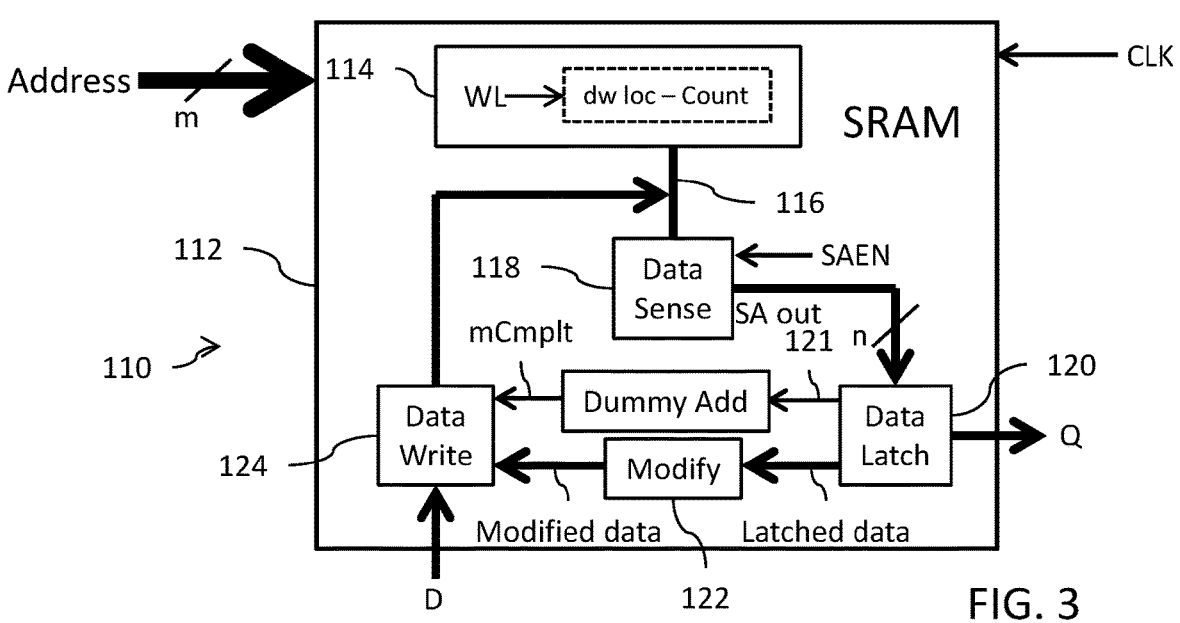
FIG. 3 shows a block diagram of a circuit configured to perform a read-modify-write operation with respect to a count value stored in a static random access memory (SRAM) using an internal modify circuit.
Figure 5:
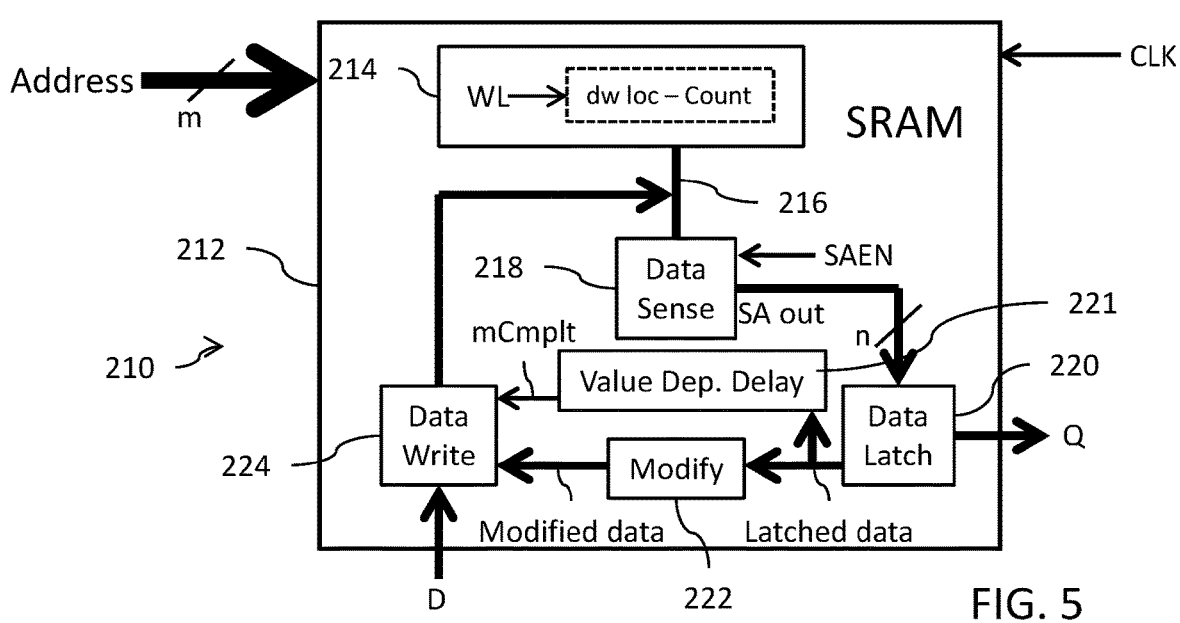
FIG. 5 shows a block diagram of a circuit configured to perform a read-modify-write operation with respect to a count value stored in an SRAM using an internal modify circuit with a dynamically variable duration self-time delay dependent on the count value read from the SRAM.

Reference is made to FIG. 5 which shows a block diagram of a circuit 210 including a static random access memory (SRAM) 212 that is configured to store data. In a particular application, the stored data is histogram data where each data word location (dw loc) in the SRAM 212 stores a count value (Count). As part of the operation of the circuit 210 for building a histogram, the count value is modified in some way (for example, incremented by one) each time the data word location is accessed. This operation typically involves three steps: step 1) reading the n-bit current count value from a particular data word location of the memory 212 accessed in response to an m-bit memory address (Address); step 2) mathematically modifying the current count value (for example, incrementing by one) with a dynamically variable duration self-time delay dependent on the read count value; and step 3) writing the modified count value back to the particular data word location in the SRAM 212. The step 2) operation for mathematically modifying the count value is advantageously performed internally within the SRAM 212. Because of this, there is no need to toggle data signals at the data output (Q) port and data input (D) port of the SRAM 212, and there is no external data calculation operation performed, and thus there is a reduction in power consumption in comparison to the solution shown in FIG. 1. Still further, by performing the mathematical modify operation internally for step 2) of the read-modify-write operation, there is no implication of external circuitry and the overall operation can be performed by the SRAM itself in a single clock cycle. Additionally, because the step 2) operation is performed with a self-time delay that has a dynamically variable duration, there is a decrease in bit line discharge (since the word line is not actuated for as long a period of time) with a corresponding decrease in expended power and peak current for bit line recharge in comparison to the fixed duration self-time delay solution shown in FIG. 3.

The SRAM 212 is clocked by a clock signal CLK and includes a memory array 214 comprising a plurality of n-bit accessible data word locations (dw loc). In response to an applied m-bit memory address (Address) and a pulsing of the clock signal CLK, a word line WL is asserted to select and access one of the data word locations in the memory array 214. The bit lines 216 of the memory array 214 are coupled to a data sensing circuit 218. The data sensing circuit 214 is formed by a plurality of sense amplifiers (one sense amplifier per data bit of the n-bit data word at the accessed data word location). The data sensing circuit 218 is enabled to perform the data sensing operation on the bit lines 216 in response to assertion of a sense amplifier enable (SAEN) signal in order to read the data word (i.e., the count value (Count)) from the accessed data word location in the memory array 214. The timing of assertion of the SAEN signal can be controlled following the leading edge of the clock signal CLK based on a dummy read operation performed by the SRAM 212. This ensures that the sense amplifiers are not enabled to drive voltages on the sense amplifier output (SA out) lines until it is clear that the data bits are available in response to assertion of the word line signal. A data latch circuit 220 then latches the read data word (here, the count value) from the SA out lines. A data modification circuit 222 that is internal to the SRAM 212 performs a data modification on the latched data word. As an example, the data modification circuit 222 may comprise an n-bit adder circuit that operates on the latched data word (which is the current count value stored in the memory) to increment by one and output the modified data word (i.e., Count+1). A value dependent delay circuit 221 determines a dynamically variable duration of the self-time delay for assertion of a data modification complete signal mCmplt. This dynamically variable duration of the self-time delay is dependent on the binary count value of the latched data word. The assertion of the data modification complete signal mCmplt signals controls timing for when to begin the write phase. This ensures that the modified data to be written back to the memory is an accurate modification. A data write circuit 224 triggered by the assertion of the data modification complete signal mCmplt then writes the data bits of the modified data word back to the bit lines 216 to be stored at the accessed data word location in the memory array 214. It will be noted that because of read multiplexing circuitry, not explicitly shown, the data sensing circuit 218 at this point in time has been disconnected from the bit lines and the SAEN signal is no longer asserted. Following completion of the data write, the word line signal is deasserted. Timing of completion of the write operation can be controlled based on a dummy write operation performed by the SRAM 212. This ensures that the data bits of the modified data word remain on the bit lines 216 for a sufficient amount of time to ensure successful write back into the memory cells M.

Figure 6:
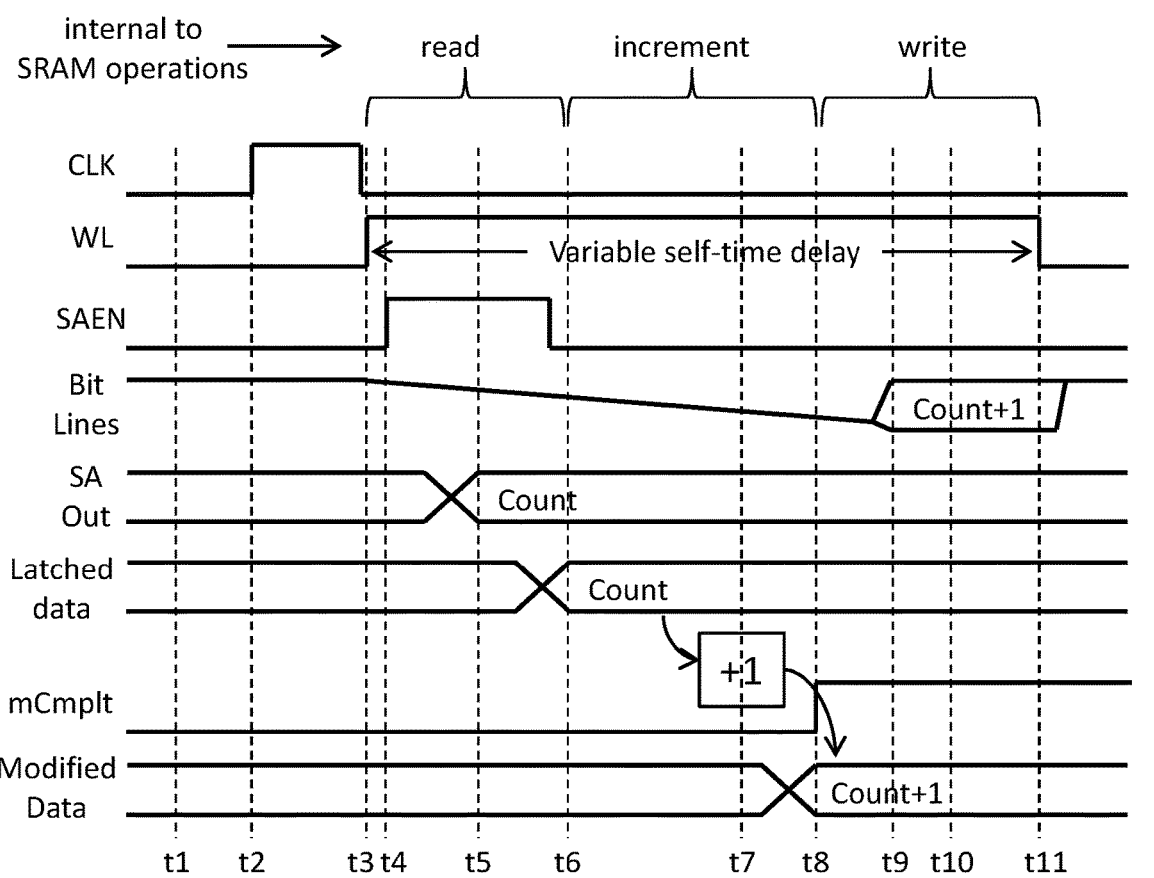
FIG. 6 shows a timing diagram for operation of the circuit of FIG. 5.

Reference is now made to FIG. 6 which shows a timing diagram for operation of the circuit 210. At time t1, the SRAM 212 is enabled for operation and the bit lines 216 are precharged to a precharge voltage level (shown here, by example only, at Vdd). At time t2, the memory address (Address) is applied and the clock signal CLK pulses. The Address is decoded by the SRAM 212 and the word line (WL) coupled to the data word location (dw loc) corresponding to the decoded Address is asserted logic high at time t3. In response to the asserted word line signal and the logic state of the stored data, the voltage on the bit lines begins to discharge from Vdd. At time t4, the sense amplifier enable (SAEN) signal is asserted logic high to enable operation of the sense amplifiers within the data sensing circuit 218. The sense amplifiers respond at time t5 to sense the voltage on the bit lines 216 and drive corresponding output signals (SA out) from the data sensing circuit 218 to logic high or logic low levels dependent on the logic state of the bits of the data word stored in the accessed data word location. Thus, the data word has been read (step 1) from the memory array 214 and the output of the data sensing circuit 218 now reflects the count value (Count). The data latch circuit 220 latches the read data word from the output of the data sensing circuit 218 at time t6, and thus the latched data also reflects the count value (Count). The data modification circuit 222 then performs the mathematical modify operation (step 2) at time t7, which in this example case is an increment by one (+1) operation, and the output modified data from the data modification circuit 222 at time t8 reflects the incremented count value (Count+1). Simultaneously, the value dependent delay circuit 221 processes the binary count value (Count) to determine a dynamically variable duration of a timing delay (that duration being dependent on the binary count value) after the expiry of which the data modification complete signal mCmplt is asserted. In response to assertion of data modification complete signal mCmplt, the data write circuit 124 then applies the data bits of the modified data word back to the bit lines 216. Because the signal on the word line (WL) remains asserted logic high, the modified data word is then written (step 3) at time t9 for storage at the accessed data word location in the memory array 214. Following completion of the data write operation at time t10, a reset is performed at time t11 and the word line (WL) is deasserted logic low.

Figure 4:
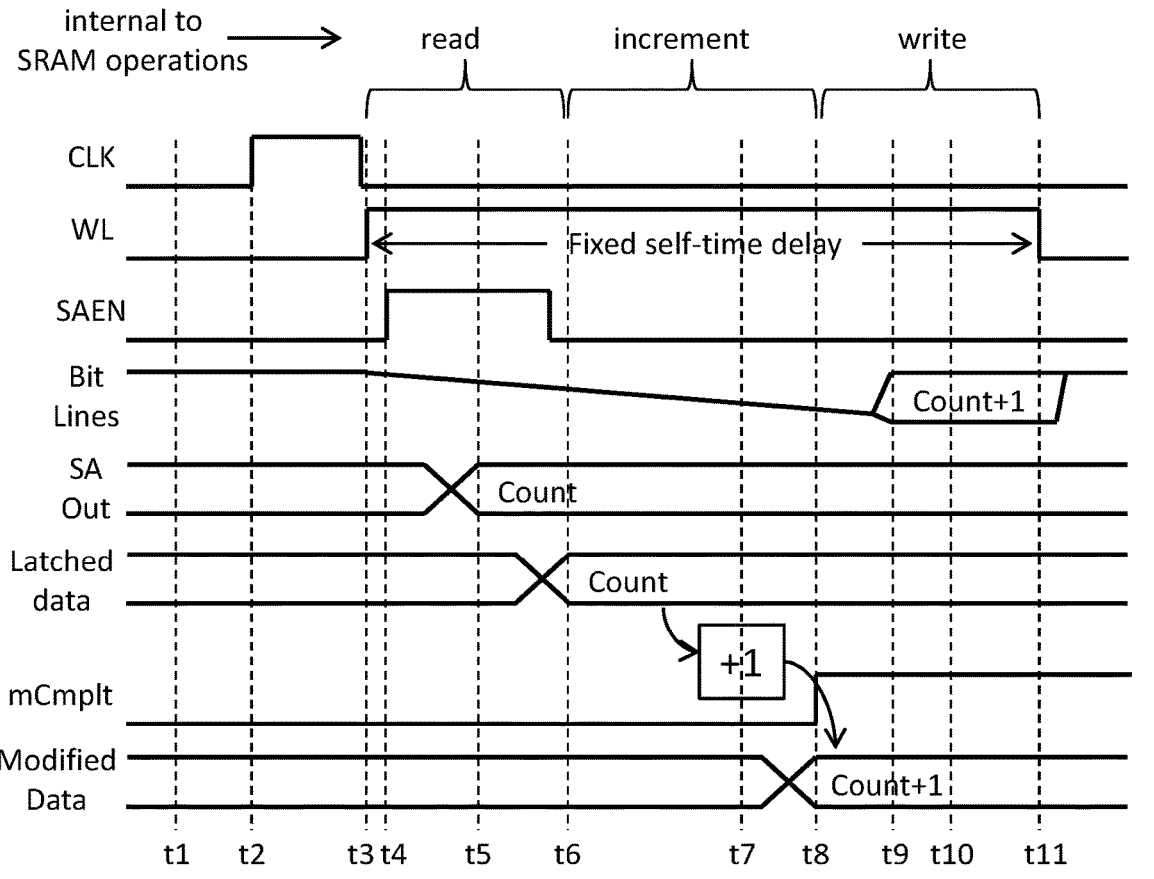
FIG. 4 shows a timing diagram for operation of the circuit of FIG. 3.

It will be noted that the duration of the self-time delay for controlling the assertion of the wordline (i.e., the time between time t3 and time t11) in this implementation is dynamically variable (and dependent on the binary count value read from the memory). The portion of the self-time delay for the read of the memory (from time t3 to time t6—step 1) is controlled by the fixed duration of time associated with performing the dummy read operation, assertion of the sense amp enable (SAEN) signal and latching of the read data by the data latch circuit. The portion of the self-time delay for the increment operation (from time t6 to time t8-step 2), however, is dynamically variable (not fixed; compare to FIG. 4) and is controlled by the dynamically variable duration of a delay time for assertion of the data modification complete signal mCmplt that is dependent on the binary count value of the latched data. Furthermore, the portion of the self-time delay for the write of the memory (from time t8 to time t11—step 3) is controlled by the fixed duration of time associated with performing the dummy write operation and writing the data back to the memory.

The foregoing may be better understood by the consideration of some examples.

Figure 7A:
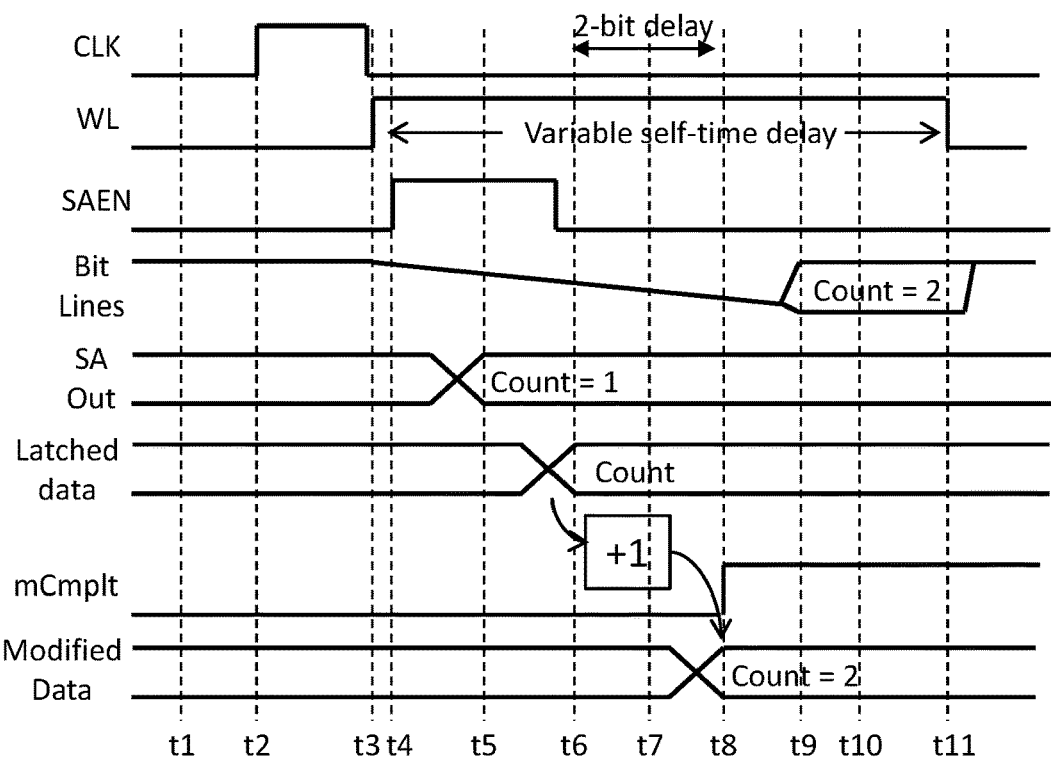
FIGS. 7A and 7B show timing diagrams for operation of the circuit of FIG. 5 illustrating the use of a dynamically variable self-time delay dependent on the read count value.

First, assume that the binary count value stored in the memory is <00000001> (or decimal 1). The binary count value <00000001> read from the memory is latched by the latch circuit. The increment operation performed by the data modification circuit 222 is an increment by one (+1) operation to generate a binary modified count value <00000010> (decimal 2). Note here that only the first and second bits of the n=8-bit data word change logic state to increment from decimal 1 to decimal 2. Once the data modification circuit 222 has completed changing those two bits, the incremented count value (Count+1) is ready at that point in time to be written back to the memory. There is no need to further delay triggering the write operation while the remaining bits are processed because their individual bit values will not change in the increment by one operation. The value dependent delay circuit 221, based on the processing of the binary count value (Count)<00000001>, determines the dynamically variable duration of the timing delay needed to process the two least significant bits by the data modification circuit 222, and then asserts the data modification complete signal mCmplt when processing of those least significant bits has been completed. FIG. 7A illustrates the variability of the portion of the self-time delay for the increment operation (from time t6 to time t8) in this example where a two bit delay for processing only the two least significant bits by the data modification circuit 222 is applied by the value dependent delay circuit before asserting the data modification complete signal mCmplt.

Now assume that the binary count value stored in the memory is <00010001> (or decimal 17). The binary count value <00010001> read from the memory is latched by the latch circuit. The increment operation performed by the data modification circuit 222 is an increment by one (+1) operation to generate a binary modified count value <00010010>

(decimal 18). Note here that only the first and second bits of the n=8-bit data word change logic state to increment from decimal 17 to decimal 18. Once the data modification circuit 222 has completed changing those two bits, the incremented count value (Count+1) is ready to be written back to the memory. There is no need to further delay triggering the write operation while the remaining bits are processed because their individual bit values will not change in the increment by one operation. The value dependent delay circuit 221, based on the processing of the binary count value (Count) <00010001>, determines the dynamically variable duration of the timing delay needed to process the two least significant bits by the data modification circuit 222, and then asserts the data modification complete signal mCmplt when processing of those least significant bits has been completed. FIG. 7A illustrates the variability of the portion of the self-time delay for the increment operation (from time t6 to time t8) in this example where a two bit delay for processing only the two least significant bits by the data modification circuit 222 is applied by the value dependent delay circuit before asserting the data modification complete signal mCmplt.

Figure 7B:
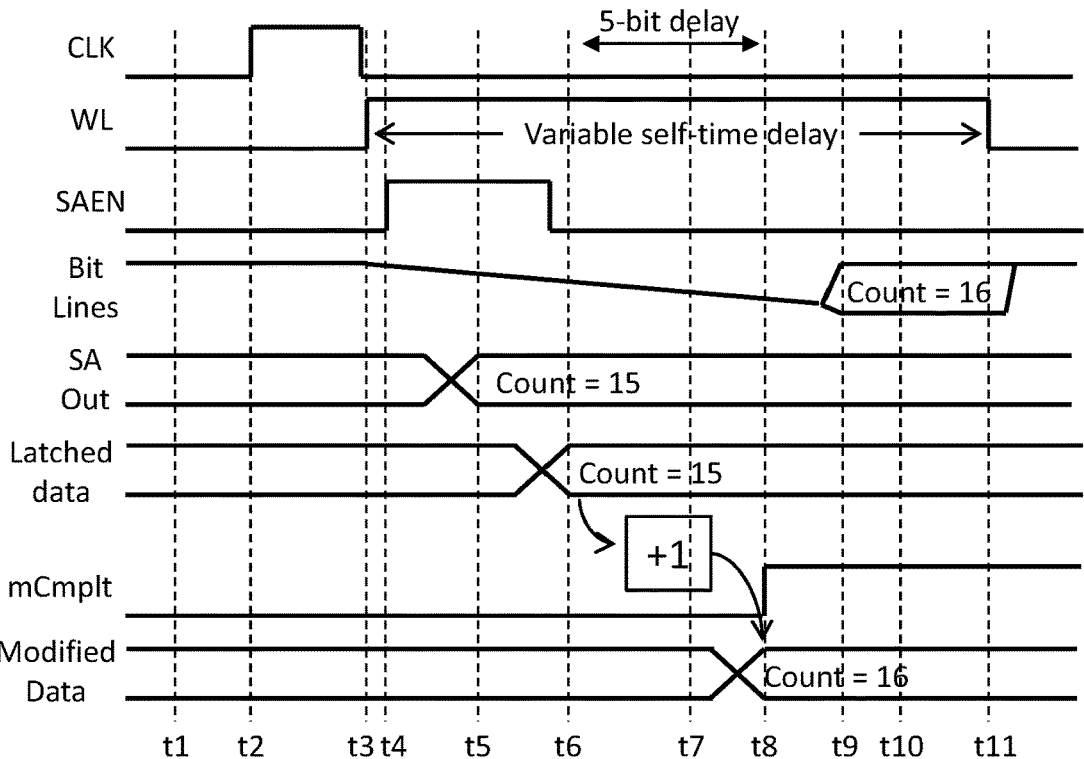

For another example, assume that the binary count value stored in the memory is <00001111> (or decimal 15). The binary count value <00001111> read from the memory is latched by the latch circuit. The increment operation performed by the data modification circuit 222 is an increment by one (+1) operation to generate a binary modified count value <00010000> (decimal 16). Note here that the first through fifth bits of the n=8-bit data word change logic state to increment from decimal 15 to decimal 16. Once the data modification circuit 222 has completed changing those five bits, the incremented count value (Count+1) is ready to be written back to the memory. There is no need to further delay triggering the write operation while the remaining bits are processed because their individual bit values will not change in the increment by one operation. The value dependent delay circuit 221, based on the processing of the binary count value (Count) <00001111>, determines the dynamically variable duration of the timing delay needed to process the five least significant bits by the data modification circuit 222, and then asserts the data modification complete signal mCmplt when processing of those least significant bits has been completed. FIG. 7B illustrates the variability of the portion of the self-time delay for the increment operation (from time t6 to time t8) in this example where a five bit delay for processing the two least significant bits by the data modification circuit 222 is applied by the value dependent delay circuit before asserting the data modification complete signal mCmplt.

To contrast this dynamically variable duration self-time delay of the circuit 210 (FIG. 5) to the fixed duration self-time delay of the circuit 110 (FIG. 3), consideration is made of the previous example where the binary count value stored in the memory is <00001111> (or decimal 15). The binary count value <00001111> read from the memory is latched by the latch circuit. The increment operation performed by the data modification circuit 122 is an increment by one (+1) operation to generate a binary modified count value <00010000>. As discussed above, the dummy adder circuit (triggered by latching of the read data word) would perform a sequential addition operation over n=8 bits and then assert the data modification complete signal mCmplt only after all eight bits are processed and the adder circuit overflows (see, FIG. 4). So, the circuit 110 would implement a fixed duration delay of eight bits while the circuit 210 would implement a dynamically variable duration delay of just five bits for the same binary count value.

Likewise, assume that the binary count value stored in the memory is <00000001> (or decimal 1). The binary count value <00000001> read from the memory is latched by the latch circuit. The increment operation performed by the data modification circuit 122 is an increment by one (+1) operation to generate a binary modified count value <00000010>. Again, the dummy adder circuit (triggered by latching of the read data word) would perform a sequential addition operation over n=8 bits and then assert the data modification complete signal mCmplt only after all eight bits are processed and the adder circuit overflows (see, FIG. 4). So, the circuit 110 would implement a fixed duration delay of eight bits while the circuit 210 would implement a dynamically variable duration delay of just two bits for the same binary count value.

The following table shows a comparison of the increment self-time delay portion for the circuits 110 and 210 for a number of example decimal values read from the memory and latched by the latch circuit (with the performance of an increment by one operation):

| Decimal | Binary value (8-bit) | | | | | | | | Increment self-time delay (bit count) | | |
|---|---|---|---|---|---|---|---|---|---|---|---|
| value (latched) | 7 | 6 | 5 | 4 | 3 | 2 | 1 | 0 | Circuit 110 | Circuit 210 | Gain |
| 0 | 0 | 0 | 0 | 0 | 0 | 0 | 0 | 0 | 8 | 1 | 7 |
| 1 | 0 | 0 | 0 | 0 | 0 | 0 | 0 | 1 | 8 | 2 | 6 |
| 2 | 0 | 0 | 0 | 0 | 0 | 0 | 1 | 0 | 8 | 1 | 7 |
| . . . | | | | | | | | | | | |
| 10 | 0 | 0 | 0 | 0 | 1 | 0 | 1 | 0 | 8 | 1 | 7 |
| . . . | | | | | | | | | | | |
| 15 | 0 | 0 | 0 | 0 | 1 | 1 | 1 | 1 | 8 | 5 | 3 |
| . . . | | | | | | | | | | | |
| 23 | 0 | 0 | 0 | 1 | 0 | 1 | 1 | 1 | 8 | 4 | 4 |
| . . . | | | | | | | | | | | |
| 67 | 0 | 1 | 0 | 0 | 0 | 0 | 1 | 1 | 8 | 3 | 5 |
| . . . | | | | | | | | | | | |
| 103 | 0 | 1 | 1 | 0 | 0 | 1 | 1 | 1 | 8 | 4 | 4 |
| . . . | | | | | | | | | | | |
| 124 | 0 | 1 | 1 | 1 | 1 | 1 | 0 | 0 | 8 | 1 | 7 |
| . . . | | | | | | | | | | | |
| 127 | 0 | 1 | 1 | 1 | 1 | 1 | 1 | 1 | 8 | 8 | 0 |
| . . . | | | | | | | | | | | |
| 219 | 1 | 1 | 0 | 1 | 1 | 0 | 1 | 1 | 8 | 3 | 5 |
| . . . | | | | | | | | | | | |

The bit delay for the circuits 110 and 210 is provided and the last column shows the gain in performance (i.e., the shortening of the self-time delay duration) for the circuit 210 in comparison to the circuit 110 for read-modify-write processing a same binary count value. For the circuit 210: the maximum increment self-time delay is an 8 bit delay; the minimum increment self-time delay is a 1 bit delay; and the average increment self-time delay is approximately a 2 bit delay (i.e., 1.97). This is contrasted to the circuit 110 where the maximum, minimum and average increment self-time delay is an 8 bit delay.

It is important to recognize that the value dependent delay circuit 221 advantageously controls the timing for assertion of the mCmplt signal in a dynamic manner that is dependent on the value of the latched data (i.e., on the read Count value) so as to provide for an improvement in, and dynamic control over, the duration of the step 2 mathematically modify portion of the single clock cycle read-modify-write operation. In comparison to fixed delay circuit implementations, like that shown in FIG. 3, there is a noted gain in performance due to the dynamic control exercised over the step 2 duration.

Figure 8:
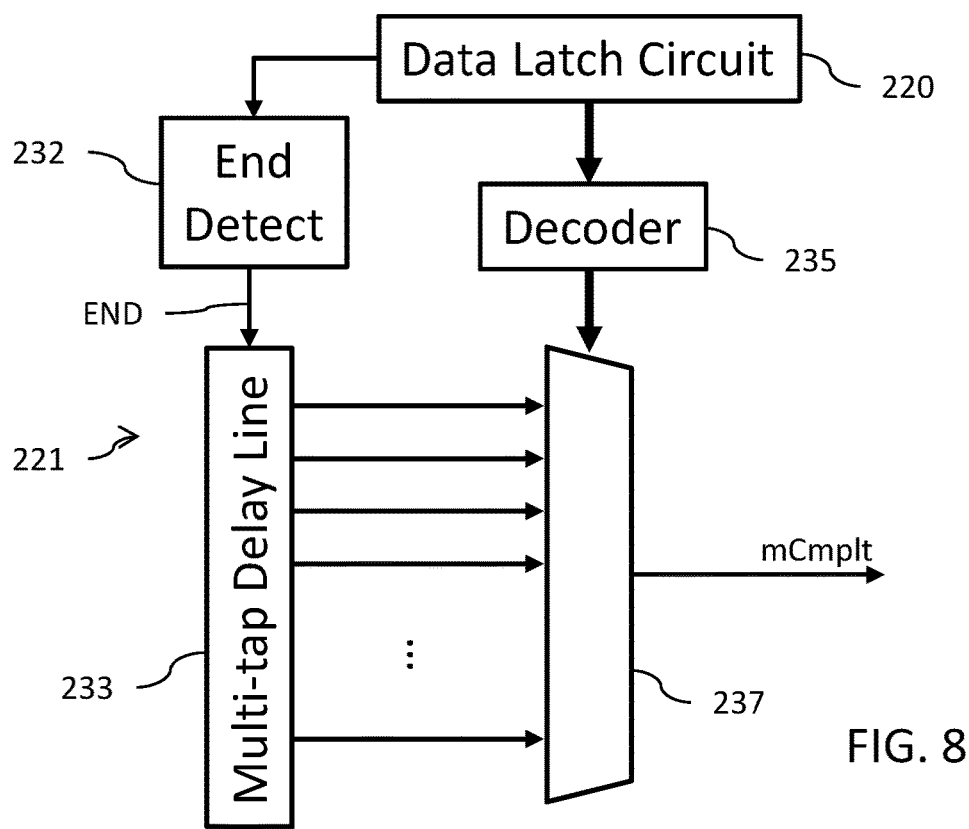
FIG. 8 is a block diagram of for an embodiment of the value dependent delay circuit.

Reference is now made to FIG. 8 which shows a block diagram for an embodiment of the value dependent delay circuit 221. A latching end detect circuit 232 is coupled to the data latch circuit 220. The latching end detect circuit 232 operates to detect when the least significant bit of the count value data sensed by the sense amplifier SA has been successfully latched by the data latch circuit 220. In response to this detection, the latching end detect circuit 232 asserts an end signal END. The end signal END is applied to the input of an n-tap delay line 233. A different time delayed version of the end signal END is output from each tap of the n-tap delay line. A decoder circuit 235 receives the read count value from the data latch circuit 220 and decodes that count value to drive selection by a multiplexing circuit 237 of the delayed end signal END for output as the data modification complete signal mCmplt. The decoder circuit 235 correlates each binary count value with a specific bit delay associated with one of the n-taps of the delay line 233. For example, for the example noted above where the binary count value stored in the memory is <00000001> (or decimal 1), there needs to be a two bit delay, so the decoder 235 would decode <00000001> to control multiplexer 237 selection of the second tap of the n-taps of the delay line 233 where the end signal END is delayed by two bits for the assertion of the data modification complete signal mCmplt. Similarly, for the example noted above where the binary count value stored in the memory is <00001111> (or decimal 15), there needs to be a five bit delay, so the decoder 235 would decode <00001111> to control multiplexer 237 selection of the fifth tap of the n-taps of the delay line 233 where the end signal END is delayed by five bits for the assertion of the data modification complete signal mCmplt.

Figure 9:
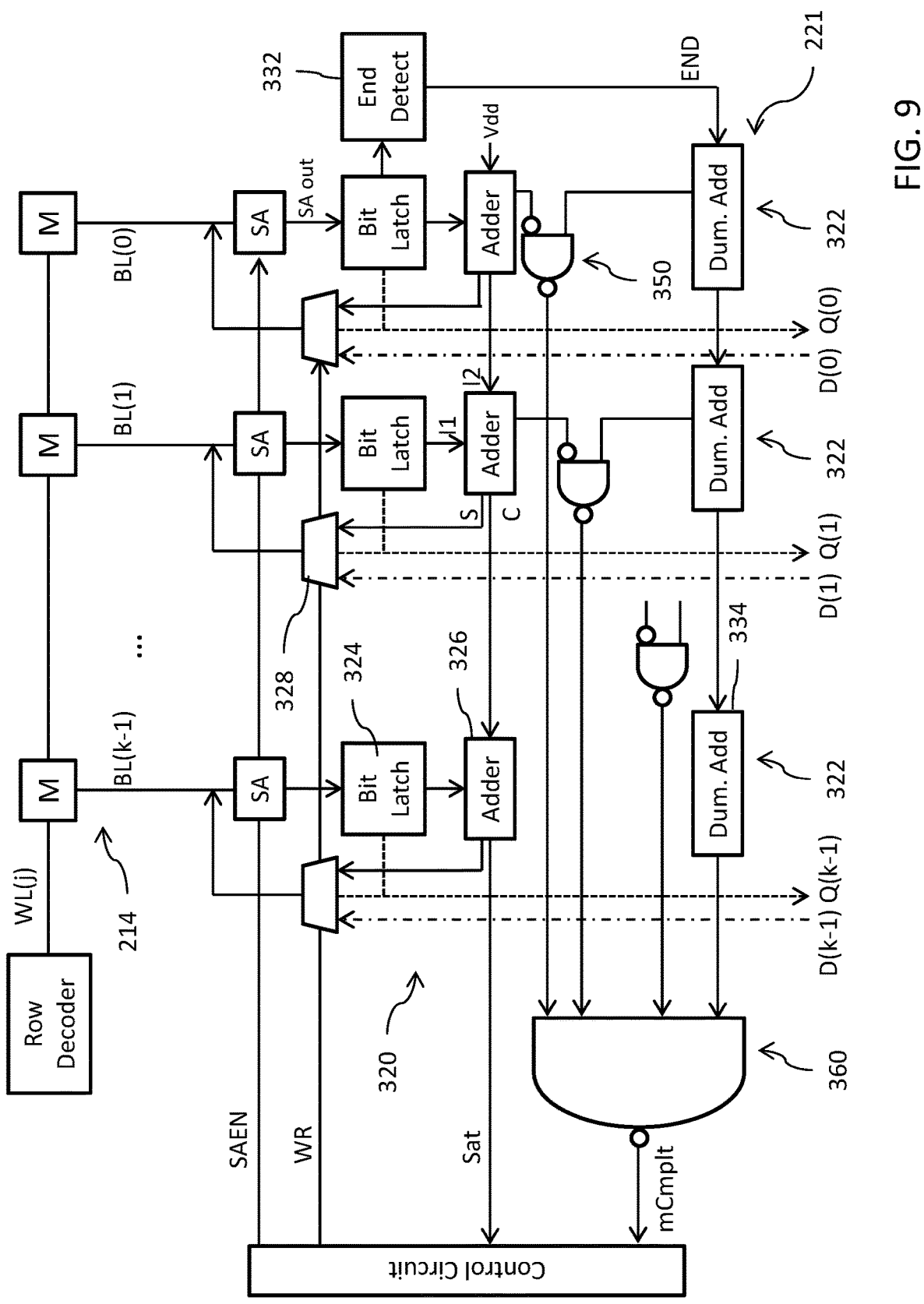
FIG. 9 is a block diagram of the memory which includes an embodiment of the value dependent delay circuit.

FIG. 9 is a block diagram of a portion of the memory 212. The memory array 214 includes a plurality of SRAM cells (M) (for example, of the 6T or 8T type as is well known in the art). The cells M are arranged in an array including j rows and k columns. The cells M in each row are coupled to a corresponding word line (WL), and the cells in each column are coupled to at least one corresponding bit line (BL). In an implementation using the 6T type SRAM circuit, a pair of complementary bit lines are present and are used in connection with both writing data to and reading data from the memory cell of a column. In an implementation using the 8T type SRAM circuit, a pair of complementary write bit lines and a single read bit line are present, with the write bit lines used in connection with writing data to the memory cell and the read bit line used in connection with reading data from the memory cell. The memory cells M of each row at a given memory address location form a bin which stores a data word corresponding to a count value (Count) of the histogram. In the illustrated implementation, the bit stored in the memory cell of column 0 is the least significant bit (LSB) of the count value and the bit stored in the memory cell of column k−1 is the most significant bit (MSB) of the count value.

The SRAM 212 further includes a row decoder circuit that is configured to receive the memory address (Address). The row decoder circuit responds thereto by decoding the received memory address and selectively actuating one word line (WL) which corresponds to the decoded memory address in the memory. Details of the circuitry for the row decoder circuit are not provided as such circuitry is well known to those skilled in the art.

The SRAM 212 further includes a control circuit that is configured to control operation of the memory circuitry to perform read and write operations. Details of the circuitry for the control circuit are not provided as such circuitry is well known to those skilled in the art.

Data input/output (I/O) circuitry 320 for the SRAM 212 includes an I/O circuit 322 for each column of the memory. Each I/O circuit 322 includes a sense amplifier SA circuit connected to the bit line BL of the corresponding column. The sense amplifier SA circuit functions, in response to assertion of a sense amplifier enable SAEN signal generated by the control circuit, to drive an output signal (SA out) to a supply rail (Vdd or ground, for example) as a function of the logic state of the data bit stored in the memory cell M of the row which is selected by the actuation of the word line WL. The plurality of sense amplifier SA circuits in the data input/output (I/O) circuitry 320 form the data sensing circuit 218 (see, FIG. 5). The logic state of the data bit output by the sense amplifier SA circuit in the SA out signal is then latched by a bit latch circuit 324. The plurality of bit latch circuits 324 form the data latch circuit 220 (see, FIG. 5). In connection with a conventional data read mode of operation for the SRAM 212, the output of each bit latch circuit 324 is coupled (see, dotted arrows) to a data output line Q(0), . . . , Q(k−1) for a corresponding bit of the data output port.

To support the read-modify-write operation with an internal modify, each I/O circuit 322 further comprises an adder circuit 326 and a write multiplexer circuit 328. Each adder circuit 326 includes a first input (I1) that is coupled to receive the latched data bit from its corresponding bit latch circuit 324 and a second input (I2) that is coupled to a carry output of a preceding adder circuit (except for the first adder circuit associated with the least significant bit column which is coupled to a logic high voltage supply node (Vdd) for the second input). Each adder circuit 326 further includes a sum output (S) that is coupled to a first input of the write multiplexer circuit 328 and a carry output (C) that is coupled to the second input of a succeeding adder circuit (except for the last adder circuit associated with the most significant bit column which provides a saturation signal Sat for the carry output that is applied back to the control circuit for use in disabling the write operation in the case where the increment by one operation would result in an overflow of the binary count value). The plurality of adder circuits 326 in the data input/output (I/O) circuitry form the data modification circuit 222 (see, FIG. 5) and function to perform an increment by one operation on the data word provided by the bits latched by the bit latch circuits 324 of the data latch circuit 220. In a preferred implementation, each adder circuit 326 is a half-adder circuit whose configuration is well known to those skilled in the art. In connection with a conventional data write mode of operation for the SRAM 312, the second input of each multiplexer circuit 328 is coupled (see, dotted-dashed arrows) to a data input line D(0), . . . , D(k–1) for a corresponding bit of the data input port. The select control input for the multiplexer circuits 328 is coupled to receive a write control signal WR generated by the control circuit. When the write control signal WR is in a first logic state, the multiplexer circuits 328 pass the data from the data input lines D(0), . . . , D(k–1) for application to the corresponding bit lines BL in order to write external data into the memory. Conversely, when the write control signal WR is in a second logic state, the multiplexer circuits 328 pass the data from the adder circuits 326 relating to the modified data in order to write internal data to the memory.

The data input/output (I/O) circuitry 320 for the SRAM 212 further includes the value dependent delay circuit 221. The value dependent delay circuit 221 comprises a latching end detect circuit 332 that is coupled to the bit latch circuit 324 for the least significant bit column. The latching end detect circuit 332 operates to detect when that least significant bit latch circuit 324 has successfully completed latching of the data logic state of the least significant bit of data sensed by the sense amplifier SA circuit. In response to this detection, the latching end detect circuit 332 asserts an end signal END. The value dependent delay circuit 221 further comprises a dummy adder circuit 334 corresponding to each adder circuit 326 (i.e., the circuits are copies or replicas of each other). Each dummy adder circuit 334 includes a first input coupled to receive a logic high voltage (Vdd; not explicitly shown) and a second input that is coupled to an output of a preceding dummy adder circuit (except for the first dummy adder circuit associated with the least significant bit column which is coupled to receive the end signal END). Each dummy adder circuit 334 further includes an output (specifically the carry output) that is coupled to the second input of a succeeding dummy adder circuit (except for the last dummy adder circuit associated with the most significant bit column which provides a carry signal).

A carry comparison circuit 350 formed by a logical NAND gate is provided for each column except for the most significant column. A first input of the logical NAND gate in a given column is coupled to receive the logical inverse of the carry output of the dummy adder circuit 334 for that column, and coupled to receive the carry output of the adder circuit 326 for that column. The output of the logical NAND gate for each carry comparison circuit 350 is applied to a corresponding input of a logical NAND gate 360. The carry signal output from the last (i.e., most significant bit) dummy adder circuit 334 is also coupled to an input of the logical NAND gate 360. The output of logical NAND gate 360 generates the data modification complete signal mCmplt).

The output of the logical NAND gate 360 will transition from logic 0 to logic 1, and thus assert the data modification complete signal mCmplt, when the signal at any of its inputs transitions from logic 1 to logic 0. This occurs, with respect to the carry signal output from the last (i.e., most significant bit) dummy adder circuit 334, whenever the dummy adder circuit overflows. This also occurs, with respect to the signal output from any of the carry comparison circuits 350, whenever the logical inverse of the carry output of the dummy adder circuit 334 for the column and the carry output of the adder circuit 326 for that column are both logic 1. More specifically, the signal output from one of the carry comparison circuits 350 will transition from logic 1 to logic 0 if the carry output of the adder circuit 326 is logic 0. The value dependent delay circuit 221 accordingly tests for the least significant bit position in the adder 326 circuit where the result of the accumulate by one operation is a bit in the logic 0 state. Because that bit is in the logic 0 state, none of the more significant bits in the modified count value will change state due to the accumulate by one operation, and the data modification complete signal mCmplt can then be asserted to begin the operation to write the modified count value back to the memory.

Consider the following example where the binary count value stored in the memory is <00000001> (or decimal 1). The binary count value <00000001> read from the memory is latched by the latch circuit and applied to the inputs of the adder circuits 326. The increment operation performed by the data modification circuit 222 is an increment by one (+1) operation to generate a binary modified count value <00000010> (decimal 2). In this case, the sum at the first (least significant) adder circuit 326 would be logic 1 and the corresponding carry output would be logic 1, which is inverted at the input of the logical NAND gate for the corresponding carry comparison circuit 350, and so the output signal from that carry comparison circuit 350 would remain at logic 1 and not trigger assertion of the data modification complete signal mCmplt output from the logical NAND gate 360. However, the sum at the second (next more significant) adder circuit 326 would be logic 1 and the corresponding carry output would be logic 0, which is inverted at the input of the logical NAND gate for the corresponding carry comparison circuit 350, and so the output signal from that carry comparison circuit 350 would transition to logic 0 and trigger assertion of the data modification complete signal mCmplt output from the logical NAND gate 360. This is a two bit delay for triggering assertion of the data modification complete signal mCmplt to begin write back of the modified count value (see, timing diagram of FIG. 7A). Note: because of the logic 0 carry at the output of the second adder circuit 326, none of the logic states for bits of the latched count value in the adder circuits for more significant bits will change as a result of the increment by one operation. There is accordingly no need to further delay assertion of the data modification complete signal mCmplt.

Now consider the example where the binary count value stored in the memory is <00001111> (or decimal 15). The binary count value <00001111> read from the memory is latched by the latch circuit and applied to the inputs of the adder circuits 326. The increment operation performed by the data modification circuit 222 is an increment by one (+1) operation to generate a binary modified count value <00010000> (decimal 16). In this case, the sum at the first (least significant) adder circuit 326 would be logic 0 and the corresponding carry output would be logic 1, which is inverted at the input of the logical NAND gate for the corresponding carry comparison circuit 350, and so the output signal from that carry comparison circuit 350 would remain at logic 1 and not trigger assertion of the data modification complete signal mCmplt output from the logical NAND gate 360. Same for the second, third and fourth bits. However, the sum at the fifth adder circuit 326 would be logic 1 and the corresponding carry output would be logic 0, which is inverted at the input of the logical NAND gate for the corresponding carry comparison circuit 350, and so the output signal from that carry comparison circuit 350 would transition to logic 0 and trigger assertion of the data modification complete signal mCmplt output from the logical NAND gate 360. This is a five bit delay for triggering assertion of the data modification complete signal mCmplt to begin write back of the modified count value (see, timing diagram of FIG. 7B). Note: because of the logic 0 carry at the output of the fifth adder circuit 326, none of the logic states for bits of the latched count value in the adder circuits for more significant bits will change as a result of the increment by one operation. There is accordingly no need to further delay assertion of the data modification complete signal mCmplt.

Figure 10:
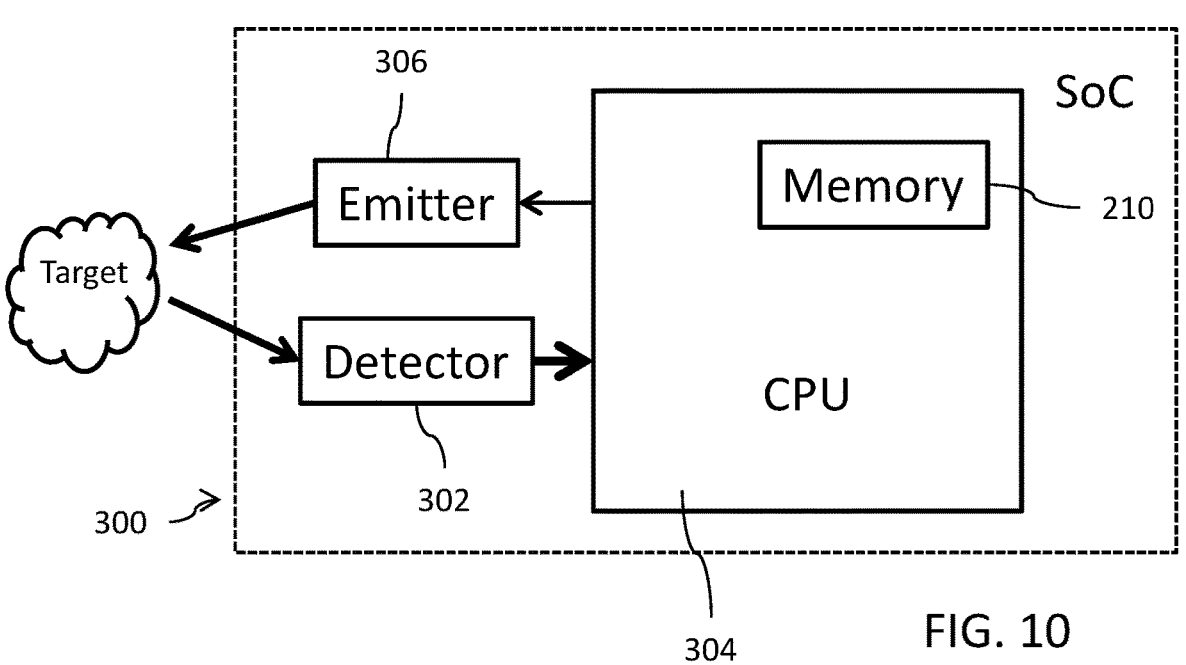
FIG. 10 is a schematic representation of a device, for example in form of an image sensor, which utilizes the circuit of FIG. 5.

Reference is now made to FIG. 10 which shows a schematic representation of a device 300 which utilizes the circuit 210 of FIG. 5. The device 300 may, for example, comprise an image sensor in the form of a System on Chip (SoC) that includes a photosensitive circuit 302 having output that is processed by a central processing unit 304. The circuit 210 may, for example, comprise a memory which is coupled to or embedded in the central processing unit 304. In a particularly pertinent example, the image sensor may comprise a time of flight (ToF) sensor as is well known in the art. Such a sensor includes an emitter circuit 306 configured to emit light pulses which are reflected by a target back towards the photosensitive circuit 302. In response to detections of the reflected light pulses, the circuit 210 is accessed by the CPU 304 at memory addresses associated with timing measurements. Each access causes a mathematical modification (for example, increment by one) of a stored count value which over time provides histogram data useful in identifying targets and the distances to those targets.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

The invention claimed is:

1. A circuit that is clocked by a clock signal, comprising:
a memory array including memory cells forming a data word location accessed in response to a word line signal;
a plurality of bit lines associated with said memory cells;
a data sensing circuit configured to sense data on said plurality of bit lines, said sensed data corresponding to a current data word stored at the data word location;
a data latching circuit configured to latch the sensed data for said current data word from the data sensing circuit;
a data modification circuit configured to perform a mathematical modify operation on the current data word to generate a modified data word;
a data writing circuit actuated in response to assertion of a data modification complete signal to apply data for the modified data word to the plurality of bit lines for writing back to the memory cells of the memory array at said data word location;
wherein the sensing of the data on said plurality of bit lines, the latching of the sensed data, the performing of the mathematical modify operation and the writing back of the modified data word all occur within a single cycle of the clock signal; and
a delay circuit configured to receive the current data word and generate of the data modification complete signal, wherein a delay duration between receipt of the current data word and assertion of the data modification complete signal is dynamically dependent on a value of the received current data word.

2. The circuit of claim 1, wherein a duration of assertion of the word line signal is dependent on the delay duration.

3. The circuit of claim 1, wherein the mathematical modify operation is an increment by one operation.

4. The circuit of claim 1, wherein said data word location forms a bin for storing a histogram data word.

5. The circuit of claim 1, further comprising an input/output circuit for each bit line, said input/output circuit comprising:
a sense amplifier circuit coupled to a bit line;
a bit latch circuit coupled to said sense amplifier circuit; and
an adder circuit for performing the mathematical modify operation, said adder circuit having a first input coupled to receive a data bit from the bit latch circuit, a second input coupled to receive data from the adder circuit of the input/output circuit for a lower significance bit line, a sum output, and a carry output coupled to supply data to the second input of the adder circuit of the input/output circuit for a higher significance bit line.

6. The circuit of claim 5, further comprising:
in each input/output circuit, a carry comparison logic gate configured to compare a logic state of the carry output of the adder circuit to a fixed logic state; and
a combination logic gate having inputs coupled to an output of each carry comparison logic gate and an output producing the data modification complete signal.

7. The circuit of claim 6, wherein the carry comparison logic gate is a logical NAND gate.

8. The circuit of claim 6, wherein the combination logic gate is a logical NAND gate.

9. The circuit of claim 6, wherein the fixed logic state for input to each carry comparison logic gate is generated at a carry output of a dummy adder circuit for each input/output circuit.

10. The circuit of claim 1, wherein the circuit comprises a data memory and wherein the memory array, the plurality of bit lines, the data sensing circuit, the data latching circuit, the data modification circuit and the data writing circuit are all component parts of the data memory which is clocked by said clock signal.

11. The circuit of claim 1, wherein said circuit is a component of an image sensing circuit.

12. A circuit that is clocked by a clock signal, comprising:
a memory array including memory cells forming a data word location accessed in response to a word line signal;
a plurality of bit lines associated with said memory cells;
a data sensing circuit configured to sense data on said plurality of bit lines, said sensed data corresponding to a current data word stored at the data word location;
a data latching circuit configured to latch the sensed data for said current data word from the data sensing circuit;
a data modification circuit configured to perform a mathematical modify operation on the current data word to generate a modified data word;
a data writing circuit actuated in response to assertion of a data modification complete signal to apply data for the modified data word to the plurality of bit lines for writing back to the memory cells of the memory array at said data word location;
wherein the sensing of the data on said plurality of bit lines, the latching of the sensed data, the performing of the mathematical modify operation and the writing back of the modified data word all occur within a single cycle of the clock signal;

a delay circuit configured to delay assertion of the data modification complete signal by a delay duration that is dynamically dependent on the current data word;

an end detect circuit configured to assert an end signal in response to detecting the latching of the sensed data for said current data word by the data latching circuit; and wherein said delay circuit applies the delay duration to the end signal to generate the data modification complete signal.

13. The circuit of claim 12, wherein the delay circuit comprises:

a multi-tap delay line having an input coupled to receive the end signal;

a decoder circuit configured to decode the current data word and generate a selection signal; and a multiplexer having inputs coupled to outputs of the multi-tap delay line, a selection input coupled to receive the selection signal, and an output producing the data modification complete signal.

14. The circuit of claim 12, wherein a duration of assertion of the word line signal is dependent on the delay duration.

15. The circuit of claim 12, wherein the mathematical modify operation is an increment by one operation.

16. The circuit of claim 12, wherein said data word location forms a bin for storing a histogram data word.

17. The circuit of claim 12, wherein the circuit comprises a data memory and wherein the memory array, the plurality of bit lines, the data sensing circuit, the data latching circuit, the data modification circuit and the data writing circuit are all component parts of the data memory which is clocked by said clock signal.

18. The circuit of claim 12, wherein said circuit is a component of an image sensing circuit.

19. A circuit that is clocked by a clock signal, comprising:

a memory array including memory cells forming a data word location accessed in response to a word line signal;

a plurality of bit lines associated with said memory cells;

a data sensing circuit configured to sense data on said plurality of bit lines, said sensed data corresponding to a current data word stored at the data word location;

a data latching circuit configured to latch the sensed data for said current data word from the data sensing circuit;

a data modification circuit configured to perform a mathematical modify operation on the current data word to generate a modified data word;

a data writing circuit actuated in response to assertion of a data modification complete signal to apply data for the modified data word to the plurality of bit lines for writing back to the memory cells of the memory array at said data word location;

wherein the sensing of the data on said plurality of bit lines, the latching of the sensed data, the performing of the mathematical modify operation and the writing back of the modified data word all occur within a single cycle of the clock signal; and a delay circuit configured to delay assertion of the data modification complete signal by a delay duration that is dynamically dependent on the current data word;

wherein the data modification circuit comprises a series of adder circuits configured to receive the current data word from the data latching circuit and perform the mathematical modify operation;

wherein the delay circuit comprises:

a series of dummy adder circuits configured to perform a dummy mathematical modify operation;

carry comparison circuitry configured to perform a bit-by-bit comparison of carry outputs of the adder circuits and dummy adder circuits; and a logic circuit configured to assert the data modification complete signal in response to the bit-by-bit comparison performed by the carry comparison circuitry.

20. The circuit of claim 19, wherein the logic circuit is configured to assert the data modification complete signal in response to an overflow of the series of dummy adder circuits.

21. The circuit of claim 19, wherein the carry comparison circuitry comprises:

a plurality of first logical NAND circuits, wherein each first logical NAND circuit has a first input coupled to a carry output of one adder circuit and a second input coupled to a carry output of one dummy adder circuit; and a second logical NAND circuit having inputs coupled to outputs of the plurality of first logical NAND circuits and an output producing the data modification complete signal.

22. The circuit of claim 19, wherein a duration of assertion of the word line signal is dependent on the delay duration.

23. The circuit of claim 19, wherein the mathematical modify operation is an increment by one operation.

24. The circuit of claim 19, wherein said data word location forms a bin for storing a histogram data word.

25. The circuit of claim 19, wherein the circuit comprises a data memory and wherein the memory array, the plurality of bit lines, the data sensing circuit, the data latching circuit, the data modification circuit and the data writing circuit are all component parts of the data memory which is clocked by said clock signal.

26. The circuit of claim 19, wherein said circuit is a component of an image sensing circuit.

27. A circuit that is clocked by a clock signal, comprising:

a memory array including memory cells forming a data word location accessed in response to a word line signal;

a plurality of bit lines associated with said memory cells;

a data sensing circuit configured to sense data on said plurality of bit lines, said sensed data corresponding to a current data word stored at the data word location;

a data latching circuit configured to latch the sensed data for said current data word from the data sensing circuit;

a data modification circuit configured to perform a mathematical modify operation on the current data word to generate a modified data word;

a data writing circuit actuated in response to assertion of a data modification complete signal to apply data for the modified data word to the plurality of bit lines for writing back to the memory cells of the memory array at said data word location;

wherein the sensing of the data on said plurality of bit lines, the latching of the sensed data, the performing of the mathematical modify operation and the writing back of the modified data word all occur within a single cycle of the clock signal;

a delay circuit configured to delay assertion of the data modification complete signal by a delay duration that is dynamically dependent on the current data word; and a row decoder circuit configured to decode a memory address identifying said data word location and assert said word line signal for a variable self-time delay dependent on the delay duration.

28. The circuit of claim 27, wherein a duration of assertion of the word line signal is dependent on the delay duration.

29. The circuit of claim 27, wherein the mathematical modify operation is an increment by one operation.

30. The circuit of claim 27, wherein said data word location forms a bin for storing a histogram data word.

31. The circuit of claim 27, wherein the circuit comprises a data memory and wherein the memory array, the plurality of bit lines, the data sensing circuit, the data latching circuit, the data modification circuit and the data writing circuit are all component parts of the data memory which is clocked by said clock signal.

32. The circuit of claim 27, wherein said circuit is a component of an image sensing circuit.

33. A circuit, comprising:
a memory array including memory cells forming a data word location accessed in response to a word line signal;
a plurality of bit lines associated with said memory cells; and
an input/output circuit for each bit line, comprising:
a sensing circuit configured to sense and latch data on a bit line;
an adder circuit configured to perform an addition operation, said adder circuit having a first input coupled to receive latched data from the sensing circuit, a second input coupled to receive data from the adder circuit of the input/output circuit for a lower significance bit line, a sum output, and a carry output coupled to supply data to the second input of the adder circuit of the input/output circuit for a higher significance bit line;
a carry comparison logic gate configured to compare a logic state of the carry output of the adder circuit to a fixed logic state; and
a data write circuit configured to write the sum output of the adder circuit to the bit line in response to assertion of a data modification complete signal; and
a combination logic gate having inputs coupled to an output of each carry comparison logic gate and an output producing the data modification complete signal.

34. The circuit of claim 33, wherein the sensing circuit comprises:
a sense amplifier circuit coupled to the bit line; and
a bit latch circuit coupled to said sense amplifier circuit.

35. The circuit of claim 33, further comprising:
an end detect circuit configured to detect latching of the data on the bit line by the sensing circuit and generate an end signal; and
a dummy addition circuit configured to process the end signal and generate the fixed logic state for application to each carry comparison logic gate.

36. The circuit of claim 20, wherein the combination logic gate has a further input coupled to receive an output of the dummy addition circuit.

37. The circuit of claim 36, wherein the dummy addition circuit comprises a plurality of dummy adder circuits, one for each adder circuit of the input/output circuit, that are connected in series with each other, wherein a carry output of each dummy adder circuit provides the fixed logic state.

38. The circuit of claim 33, wherein the circuit comprises a data memory and wherein the memory array, the plurality of bit lines and the input/output circuits are all component parts of the data memory.

39. The circuit of claim 38, wherein the data memory is clocked by a clock signal, and wherein the sensing and latching of the data by the sensing circuit, and the addition operation performed by the adder circuit, all occur within a single cycle of the clock signal.

40. The circuit of claim 33, wherein said data word location forms a bin for storing a histogram data word.

41. The circuit of claim 33, further comprising a decoder circuit configured to decode a memory address identifying said data word location and assert said word line signal for a variable self-time delay controlled by said assertion of the data modification complete signal.

42. The circuit of claim 33, wherein said circuit is a component of an image sensing circuit.

43. The circuit of claim 33, wherein the carry comparison logic gate is a logical NAND gate.

44. The circuit of claim 33, wherein the combination logic gate is a logical NAND gate.

* * * * *